United States Patent
Sandhu et al.

(10) Patent No.: US 6,596,636 B2
(45) Date of Patent: *Jul. 22, 2003

(54) ALD METHOD TO IMPROVE SURFACE COVERAGE

(75) Inventors: Gurtej Sandhu, Boise, ID (US); Garo J. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/059,308

(22) Filed: Jan. 31, 2002

(65) Prior Publication Data

US 2002/0090829 A1 Jul. 11, 2002

Related U.S. Application Data

(63) Continuation of application No. 09/716,288, filed on Nov. 21, 2000, now Pat. No. 6,355,561.

(51) Int. Cl.⁷ .............................................. H01L 21/44
(52) U.S. Cl. ...................... 438/676; 438/675; 438/678; 438/687
(58) Field of Search ................. 438/676, 626, 438/687, 652, 675, 678, 685, 638, 637, 642, 584

(56) References Cited

U.S. PATENT DOCUMENTS

| | | |
|---|---|---|
| 5,270,247 A | 12/1993 | Sakuma et al. |
| 5,340,408 A | 8/1994 | Boer |
| 5,344,792 A | 9/1994 | Sandhu et al. |
| 5,399,881 A | 3/1995 | Bozovic et al. |
| 5,480,818 A | 1/1996 | Matsumoto et al. |
| 5,612,558 A | 3/1997 | Harshfield |
| 5,696,017 A | 12/1997 | Ueno |
| 5,746,826 A | 5/1998 | Hasegawa et al. |
| 5,851,849 A | 12/1998 | Comizzoli et al. |
| 5,879,459 A | 3/1999 | Gadgil et al. |
| 5,899,725 A | 5/1999 | Harshfield |
| 5,908,947 A | 6/1999 | Vaartstra |
| 5,923,056 A | 7/1999 | Lee et al. |
| 5,942,799 A | 8/1999 | Danek et al. |
| 5,976,976 A | 11/1999 | Doan et al. |
| 5,981,319 A | 11/1999 | Lothian et al. |
| 5,994,775 A | 11/1999 | Zhao et al. |
| 5,997,639 A | 12/1999 | Iyer |
| 6,069,072 A * | 5/2000 | Konecni et al. |
| 6,139,700 A * | 10/2000 | Kang et al. |
| 6,432,819 B1 * | 8/2002 | Pavate et al. ............... 438/676 |
| 6,458,694 B2 * | 10/2002 | Ogure et al. ................ 438/652 |

FOREIGN PATENT DOCUMENTS

| | | | |
|---|---|---|---|
| WO | WO 98 23389 | * | 6/1998 |
| WO | WO 00 47404 | * | 8/2000 |
| WO | WO 00/61833 | * | 10/2000 |

* cited by examiner

*Primary Examiner*—Michael S. Lebentritt
(74) *Attorney, Agent, or Firm*—Dickstein Shapiro Morin & Oshinsky LLP

(57) ABSTRACT

A method of depositing a thin film on a substrate in a semiconductor device using Atomic Layer Deposition (ALD) process parameters exposes the substrate to at least one adherent material in a quantity sufficient for the material to adsorb onto the substrate and thereby form an initiation layer. The initiation layer presents at least one first reactive moiety which is then chemically reacted with at least one first reaction material using atomic layer deposition conditions to form a second reactive moiety. The second reactive moiety is then chemically reacted with at least one second reaction material under process conditions sufficient to form a reaction layer over the initiation layer. The process may be repeated to form successive reaction layers over the initiation layer. The adherent material constituting the initiation layer is preferably one which is not substantially degraded by the atomic layer deposition parameters. The initiation layer together with one or more reaction layer(s) constitutes the final film.

33 Claims, 4 Drawing Sheets

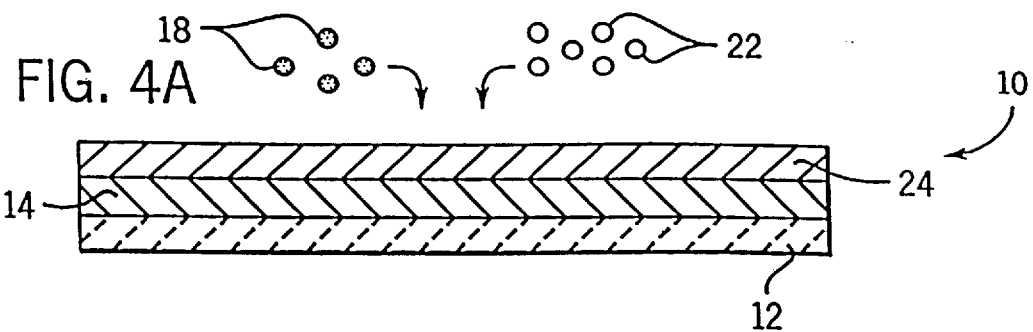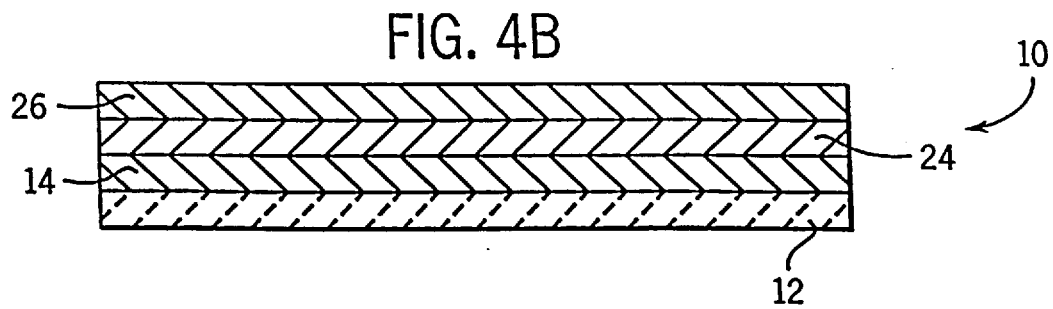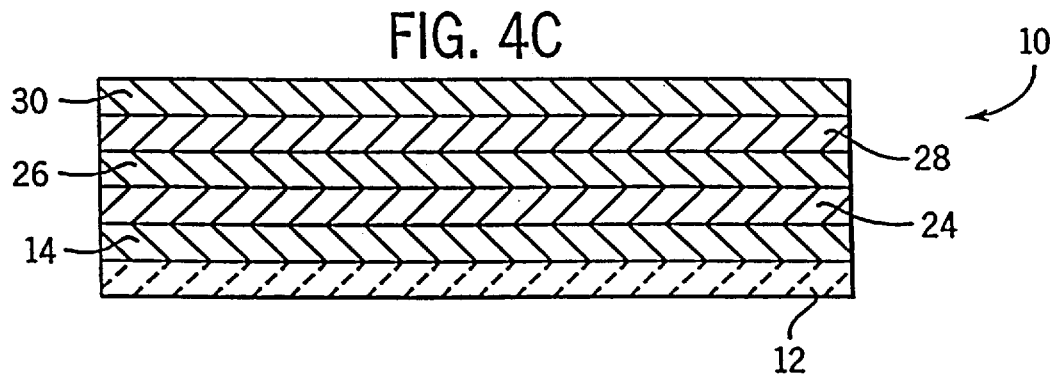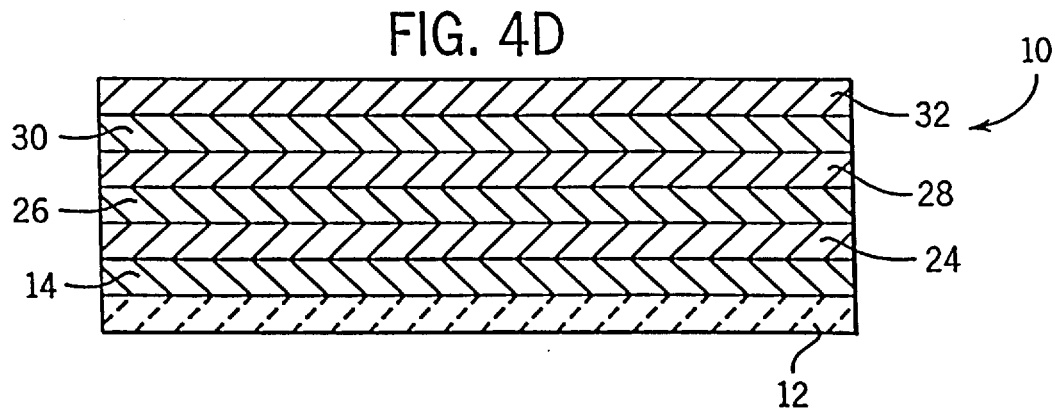

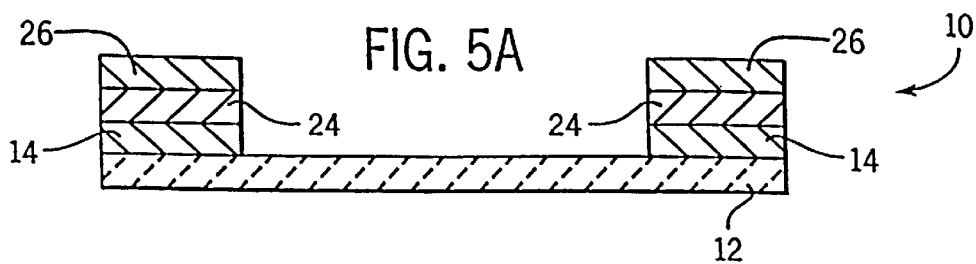
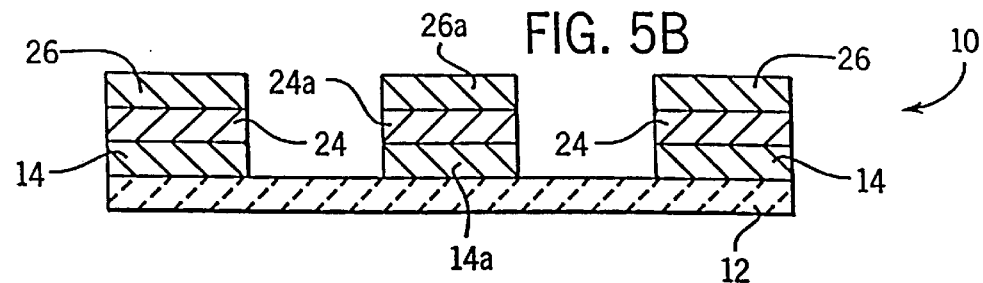
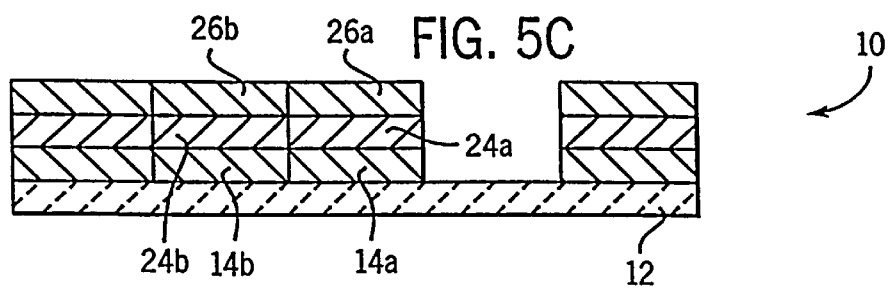
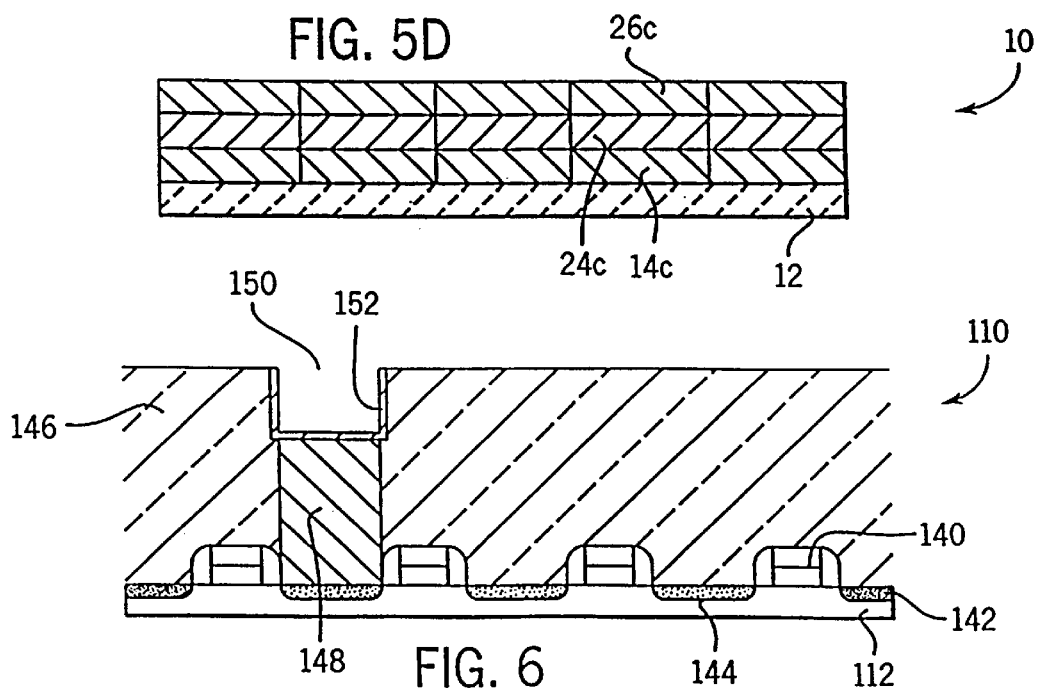

ALD METHOD TO IMPROVE SURFACE COVERAGE

This application is a continuation of application Ser. No. 09/716,288, entitled ALD METHOD TO IMPROVE SURFACE COVERAGE, filed Nov. 21, 2000, now U.S. Pat. No. 6,355,561, the entirety of which is hereby incorporated by reference.

FIELD OF THE INVENTION

The invention relates to a method for depositing a film on a substrate in a semiconductor device, and more particularly, to an atomic layer deposition process for improving surface coverage using an adherent material. The invention also relates to novel film compositions having successive layers built upon a material which is adsorbed onto the surface of a substrate.

BACKGROUND OF THE INVENTION

Various technologies have now been developed for applying thin films to substrates used in manufacturing semiconductor devices. Among the more established techniques is Chemical Vapor Deposition (CVD). Atomic Layer Deposition (ALD), a variant of CVD, is a relatively newer technology now emerging as a potentially superior method of achieving highly uniform, conformal film deposition. ALD, although a slower process than CVD, has often demonstrated an outstanding ability to maintain ultra-uniform thin deposition layers over complex topology. This is at least partially true because ALD is not as flux dependent as is CVD. This flux-independent nature of ALD allows processing at lower temperatures than with conventional CVD methods.

ALD processes proceed by chemisorption at the deposition surface of the substrate. The technology of ALD is based on concepts of atomic layer epitaxy developed years earlier for growing polycrystalline and amorphous films of zinc sulfide, for example, and dielectric oxides for electroluminescent display devices. The technique of ALD is based on the principle of the formation of a saturated monolayer of reactive precursor molecules by chemisorption. In ALD appropriate reactive precursors are alternately pulsed into a deposition chamber. Each injection of a reactive precursor is separated by an inert gas, e.g. Ar, purge. Each precursor injection provides a new atomic layer additive to previously deposited layers to form a uniform layer of solid film. The cycle can be repeated until the desired film thickness is attained. Thus, the introduction of the gas Ax is followed by introduction of a gas By to form a layer of AB material. This process of introducing Ax and then By can be repeated a number of times to achieve an AB film of a desired thickness.

While ALD typically allows for the formation of high quality, uniform films across a wide array of surface topologies, problems can still arise. In general, deposition initiation, i.e. formation of the first layer or few layers, is often the most problematic stage of film formation with ALD. In the preceding example, for instance, the subgroup x on the Ax gas can be a large, bulky molecule which can sterically hinder the formation of a continuous monolayer. In addition, the chemisorbent nature of Ax may be such that while it adheres adequately to the underlying substrate, it can adsorb to other materials and thereby interfere with the subsequent reaction of compounds utilized to form succeeding layers.

What is therefore needed in the art is a new method of ALD which overcomes the disadvantages associated with this deposition technique. Also needed is a new film composition for use on a wide array of substrates in semiconductor devices.

SUMMARY OF THE INVENTION

The invention provides a method of depositing a film on a substrate in a semiconductor device. Using ALD process conditions hereinafter described, the substrate is first exposed to at least one adherent material in a quantity sufficient for the material to adhere or adsorb onto the surface of the substrate and thereby form an initiation layer over the substrate. The initiation layer presents at least one first reactive moiety which is then chemically reacted with at least one first reaction material to form a second reactive moiety. The second reactive moiety is then chemically reacted with at least one second reaction material so as to form a reaction layer over the initiation layer. The initiation layer is not substantially degraded during formation of the reaction layer, and together with the reaction layer can constitute the final film. Additional reaction layers may also be formed over the initiation layer, and all these layers together will then constitute the final film.

In a further aspect of the invention, there is provided a film suitable for use on a substrate in a semiconductor device. The film has an initiation layer of an adherent material, and one or more reaction layers formed over the initiation layer. Each of the reaction layers may be comprised of a metal or metal-bearing compound.

Additional advantages and features of the present invention will become more readily apparent from the following detailed description and drawings which illustrate various embodiments of the invention.

BRIEF DESCRIPTION OF THE DRAWINGS

FIGS. 4A, 4B, 4C and 4D are cross sectional views of the device shown in FIG. 2 in further stages of fabrication.

FIGS. 5A, 5B, 5C and 5D are cross sectional views of a semiconductor device in successive stages of fabrication according to an alternative embodiment of the invention.

FIG. 6 is a cross sectional view of a semiconductor device illustrating a barrier film according an embodiment of the invention.

DETAILED DESCRIPTION OF THE PREFERRED EMBODIMENTS

The invention relates to the formation of film on substrates in is semiconductor devices using atomic layer deposition (ALD).

Reference herein shall also be made to the terms "wafer" and "substrate", which are to be understood as including a silicon base, silicon-on-insulator (SOI) or silicon-on-sapphire (SOS) structures, doped and undoped semiconductors, epitaxial layers of silicon supported by a base semiconductor foundation, and other semiconductor structures. In addition, when reference is made to a "wafer" or "substrate" in the following description, previous process steps may have been utilized to form arrays, regions or junctions in or on the base semiconductor structure or foundation. In addition, the semiconductor need not be silicon-based, but could be based on silicon-germanium, germanium or gallium arsenide. The term "substrate" as used herein may also refer to any type of generic base or foundation structure.

Figure 1:
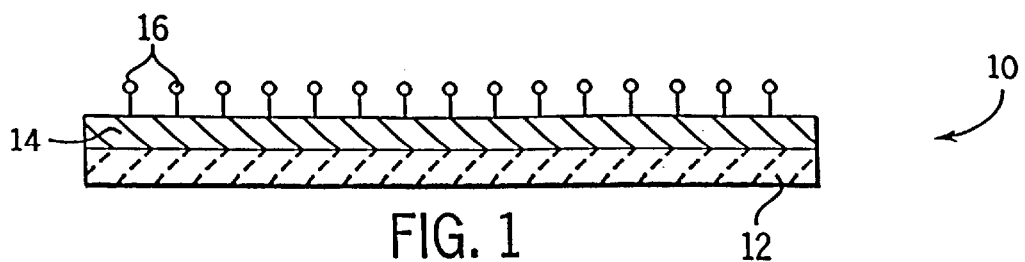
FIG. 1 is a cross-sectional view of a semiconductor device in an intermediate stage of fabrication.

Referring now to the drawings in which like numerals indicate like components throughout the various embodiments, FIG. 1 is a cross sectional view of a semiconductor device 10 having a substrate 12 in an intermediate stage of fabrication. According to the invention, an initiation layer 14 is first deposited on the substrate 12 under reaction conditions utilized for ALD. Thus, the reaction is conducted in a suitable ALD reaction chamber at a temperature within the range of about 100° C. to about 600° C. Preferably, the operating temperature is within the range of about 200° C. to about 400° C., and more desirably is within the range of about 250° C. to about 350° C. The operating pressure for the ALD process is typically within the range of about 1.0 milliTorr to about 10 Torr, and more preferably about 30 milliTorr to about 1 Torr. Flow rates of the gaseous material entering the ALD reaction chamber can vary, and can easily be adjusted by the skilled artisan.

The initiation layer 14 is comprised of an adherent material which adheres or sticks to the surface of the substrate 12. In a preferred embodiment, the adherent material may also be referred to as a chemisorbent, adsorbent, or chemiadsorbent material. The terms "chemisorbs", "adsorbs", and "chemiadsorbs" are to be understood as being interchangeable herein and shall mean that the initiation layer, by means of physical and/or chemical forces, adheres or sticks to the surface of the substrate 12. Thus, the initiation layer may preferably be said to be comprised of a "chemisorbent" material, and thus the term "chemisorbent" is meant to encompass all mechanisms, including chemical, physical and combination mechanisms, by which the initiation layer can adhere or stick to the substrate 12. While all such compounds or materials are contemplated for use herein, it is preferred that the adherent material be substantially substrate-independent, meaning that it can adhere to a wide variety of semiconductor substrate materials, particularly a wide range of silicon-based compounds, e.g. silicon and doped polysilicon. A preferred adherent material for use as the initiation layer 14 is a titanium containing compound, of which tetrakisdimethylamino titanium (Ti(—N($CH_3$)$_2$)$_4$) (TDMAT) and titanium chloride (TiCl$_4$) are desirable, either alone or in combination. TDMAT may be especially desirable, and has now been shown to be an especially good adherent material. Another useful adherent material is zinc chloride. Other useful compounds can include tetraethoxyorthosilicate (TEOS), aluminum trichloride, trimethylgallium, trimethyl aluminum and trimethylzinc, for example.

It is preferable that the level of adsorption to the substrate 12 by the adherent material forming the initiation layer 14 be at least within the range of about 1% to about 10%. More preferably, the level of adsorption should preferably be at least about 30%. This means that during formation of the initiation layer, a total quantity equal to or greater than about 30% of the surface area of the substrate 12 will preferably have the adherent material adhere or chemiadsorb thereto. Current adsorption techniques often only result in a small quantity or even a negligible portion of the surface area of the substrate being covered. The invention herein contemplates a much higher level of adherence. It is therefore desirable to have a level of adherence in excess of about 50%. It is even more preferred to attain in excess of about 80%, and even in excess of about a 90% level of adherence. With this higher level of adherence, there is more material that is adhered or adsorbed to the substrate surface, which in turn means there are more attendant chemical moieties available for subsequent reaction to form additional film layers, as hereinafter described. A higher level of adherence also means that the initiation layer is well anchored to the substrate and can in turn support additional film layers. The actual level of adherence obtained may ultimately depend upon several factors, including the chemisorbent material(s) utilized, the composition and topography of the substrate, as well as on the process parameters heretofore described.

While the initiation layer 14 should have a high level of adherence to the surface of the substrate, there should be substantially no adherence by the initiation layer, or more specifically its attendant chemical moieties, to any other film-forming materials as set forth in more detail below. In other words, the initiation layer should not stick or adhere to these additional film-forming materials in the chemisorption sense, but should instead chemically react with them in the traditional sense to form the additional film layers.

The adherent material forming the initiation layer 14 should present at least one reactive moiety 16 as a component thereof This moiety 16 may be any chemical moiety which is capable of further chemical reaction. While not wishing to be bound by any particular theory, it appears that the reactive moiety 16 will protrude or extend from the surface of the initiation layer so as to be in a sterically favored position for further chemical reaction. Chemical ligand groups can constitute the reactive moiety 16 (e.g.—$CH_3$, —$NH_3$), as can individual atoms, such as a hydrogen (—H) or a chloro—(—Cl) group, for example. As a further example, the reactive moieties 16 presented by the compound TDMAT are one or more dimethyl amino ligands (—N($CH_3$)$_2$), e.g. as —Ti(—N($CH_3$)$_2$)$_3$, =Ti(—N($CH_3$)$_2$)$_2$, ≡Ti(—N($CH_3$)$_2$). In the example using titanium chloride (TiCl$_4$), the reactive moieties 16 would be the chloro—(—Cl) substituents, e.g. as —TiCl$_3$, =TiCl$_2$ and ≡TiCl.

Figure 2A:
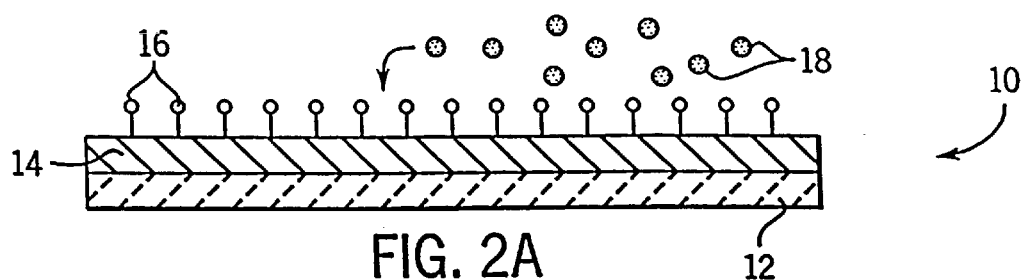
FIGS. 2A and 2B are cross-sectional views of the device shown in FIG. 1 in further stages of fabrication.
Figure 2B:
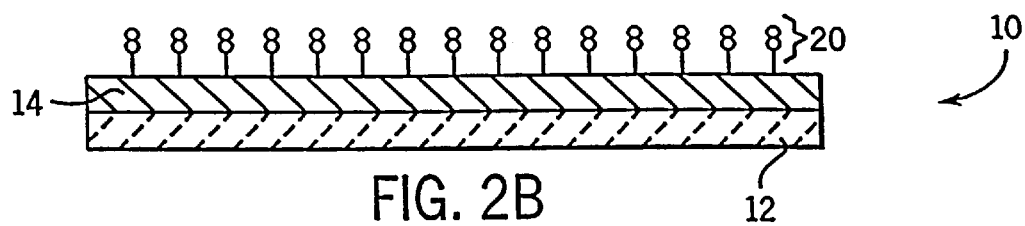

Referring now to FIG. 2A, the first reactive moiety 16 of the adherent material forming the initiation layer 14 is reacted with at least one first reaction material 18. With reference now to FIG. 2B, under the aforesaid ALD conditions the first reaction material 18 reacts with the first reactive moiety 16 to form a second reactive moiety 20. The reaction may be a displacement reaction, for example, with one or more chemical components of the first reaction material 18 displacing one or more components of the first reactive moiety 16 to form the second reactive moiety 20. In the example in which TDMAT functions as the adherent material for the initiation layer 14 with one or more exposed dimethyl amino ligands as the first reactive moiety(ies) 16, the first reaction material 18 may be one or more compounds selected from the group consisting of gaseous nitrogen-containing compounds, including mixtures thereof. These compounds can include, for example, nitric oxide, nitrous oxide, nitrogen, and ammonia ($NH_3$). Nitrogen and ammonia are preferred, and ammonia is particularly preferred. Introduction of ammonia, for example, allows for the formation of a Ti—N—H linkage unit as the second reactive moiety 20. Other suitable first reaction materials 18 can include $SiH_4$, $PH_3$, $H_2S$ and even water vapor.

Figure 3A:
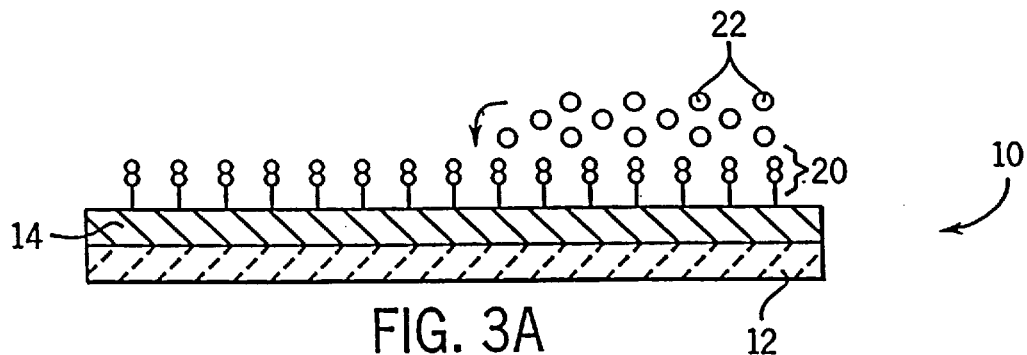
FIGS. 3A and 3B are cross sectional views of the device shown in FIG. 2 in further stages of fabrication.

Referring now to FIG. 3A, the ALD process continues in which a second reaction material 22 is reacted with the second reactive moiety 20. The second reaction material 22 can be any chemical element or compound which will react with the moiety 20 to form a film layer over the initiation layer 14. In certain embodiments, the second reaction material 22 may be water vapor. In other embodiments, the second reaction material is preferably a metal or metal-bearing compound. Of these, tungsten-bearing compounds may be especially desirable. Tungsten hexafluoride ($WF_6$) is particularly preferred for use when TDMAT is utilized as the adherent material for the initiation layer 14, and when a nitrogen-bearing compound is used as the first reaction material 18. Introduction of $WF_6$ as the second reaction material 22 permits the displacement of hydrogen (—H) groups to form Ti—N—W—F bonds.

Figure 3B:
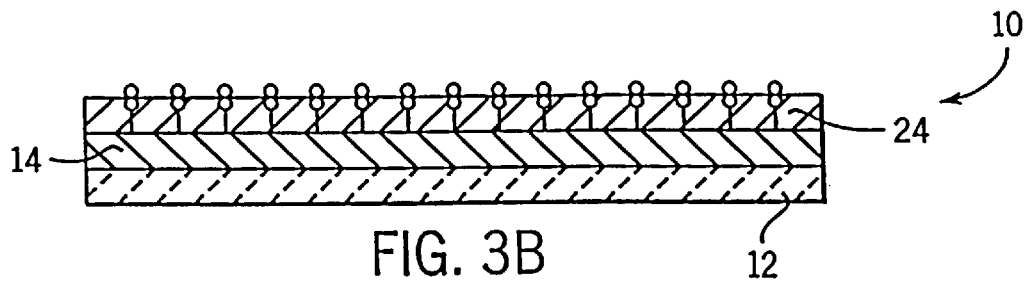

Referring now to FIG. 3B, a reaction layer 24 is formed from the reaction of the second reactive moiety 20 with the second reaction material 22. The reaction layer 24 at least partially overlays the initiation layer 14, and should preferably cover most or all of the initiation layer. In addition, under ALD process conditions as heretofore described it is preferable that the initiation layer 14 not be substantially degraded during the reaction between the second reactive moiety 20 and the second reaction material 22 which culminates in the formation of the reaction layer 24. In other words, the invention provides that at least a substantial majority of the initiation layer 14 initially formed on the surface of the substrate 12 will still be adsorbed thereto after formation of the reaction layer 24. More desirably, at least about 90% of the initiation layer will still be adsorbed to the substrate 12 after formation of the reaction layer 24. It is even more preferred that at least about 95% of the initiation layer remain intact during the ALD process. More preferably, about 100% of the initiation layer is preserved.

In an additional embodiment of the invention shown in FIGS. 4A through 4D, further subsequent introduction of the first reaction material 18, either alone, or together with further subsequent introduction of the second reaction material 22 can permit the formation of additional or successive reaction layers 26, 28, 30 and 32 etc. over the first reaction layer 24 using the ALD process parameters (temperature, pressure and flow rate) as heretofore described. There is theoretically no limit to the number of additional reaction layers which may be formed in this manner, depending upon the final thickness of the film desired. There can be at least about one, two, three, four or even about five or more additional reaction layers. In certain embodiments, there can be in excess of five additional layers and as many as about ten or more successive reaction layers formed over the first reaction layer 24. The initiation layer 14 together with the reaction layer(s) 24, 26, 28, 30 and 32 etc. will constitute the final film on the substrate 12.

It is preferable that the initiation layer and the reaction layer(s) be comprised of different materials. Thus in the example using TDMAT to form the initiation layer 14, it may be preferred to deposit successive reaction layers of WNx (using $NH_3$ as the first reaction material 18 and $WF_6$ as the second reaction material 22) over a layer of Ti to form the final film (wherein x is preferably an integer 1, 2, 3, 4 etc.). Once again, it should be noted that the initiation layer 14 is not substantially degraded during formation of each of the successive reaction layers, in the manner as heretofore described. Moreover, the initiation layer is a relatively thin layer compared to the first reaction layer 24, and by extension, to any additional layers 26, 28, 30 and 32 etc. formed thereover. The initiation layer should not be greater than about 50 Angstroms thick, and preferably should not exceed about 10 Angstroms in thickness. It is further desirable that the initiation layer not be more than about 1 or 2 Angstroms thick. Each reaction layer may be anywhere from about twice the thickness of the initiation layer to more preferably within the range of about 10 times to about 100 times as thick. Overall, the final film is typically on the order of about a few hundred Angstroms to several hundred Angstroms in thickness.

Referring now to FIGS. 5A through 5D, there is shown another embodiment of the invention. Many adherent materials which constitute the initiation layer 14 may present large, bulky and/or sterically unfavored reactive moieties 16 which can make the uniform deposition of film layers problematic. In order to achieve a highly conformal film with substantially uniform thickness reaction layers 24, and 26 etc. thereover, it may be desirable to initially proceed with formation of one or more initiation layers 14, together with reaction layer(s) 24 and 26 etc. as heretofore described on only one part or parts of the substrate 12, as shown in FIG. 5A. Thereafter as shown in FIG. 5B, the process is then repeated starting with additional deposition of adherent material constituting the initiation layer 14a onto the substrate 12, followed by the deposition of layers 24a and 26a, etc. As shown in FIGS. 5C and 5D, successive reaction layers 24b, 26b and 24c, 26c may then be formed on the newly installed initiation layer(s) 14b and 14c, respectively. Successive deposition in this manner often permits the final film to be formed and "built up" in a manner which makes the most advantageous use of the chemical reactivities of the reaction moieties 16 and 20 (shown in FIGS. 1, 2 and 3) present on the initiation layer, while minimizing any steric disadvantages these moieties may present. Films formed in this manner can often be more uniformly applied than those which are traditionally formed Due at least in part to their improved surface coverage, the films herein described have wide applicability in the semiconductor industry. One example is the use of the film of the invention as a barrier film, as is shown in FIG. 6. A semiconductor device 110 has a substrate 112 with gate stacks 140 formed thereon. Field oxide regions 142 and gate oxide regions 144 are also formed in the substrate 112. An insulative layer 146, usually of a material such as Boro-Phospho-Silicate Glass (BPSG) is also formed over the substrate 112 and gate stacks 140. The layer of insulating material 146 may, in actuality, be formed as one or more layers of insulating material of, for example, BPSG. Shown implanted in the insulative layer 146 is a conductor plug 148, which may be formed of a suitable material known in the art. A via or contact 150 has been formed over the conductor plug 148 using wet or dry etching or other known techniques. A barrier film 152 is formed on the sides of the contact 150 using the method of the invention. The barrier film 152 acts to prevent reaction between the material constituting the conductor plug 148 and any subsequent material which is introduced into the contact 150. As an example, the barrier film may be formed of a thin initiation layer of Ti formed from TDMAT, with successive reaction layers thereover of WNx using $NH_3$ as the first reaction material and $WF_6$ as the second reaction material.

Figure 7:
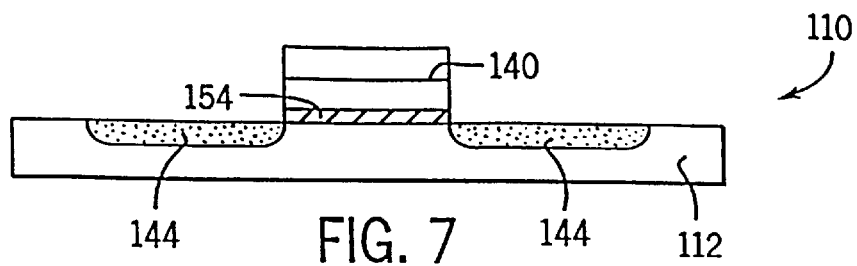
FIG. 7 is a cross sectional view of a semiconductor gate stack showing a silicon dioxide film according to an embodiment of the invention.

Still another embodiment of the invention is shown in FIG. 7. Prior to formation of the gate stacks 140, the gate film 154 of the invention may be formed atop the substrate 112. The gate film 154 is formed of a layer such as silicon dioxide ($SiO_2$) formed over an initiation layer of TEOS. The $SiO_2$ layer is in turn formed from $SiH_4$ as the first reaction material and $H_2O$ vapor as the second reaction material.

Upon formation of the gate film 154, the gate stacks are then formed thereover using methods known in the art. The parts of the film 154 which are not in contact with the gate stack 140 are removed using etching or CMP methods known in the art.

Figure 8:
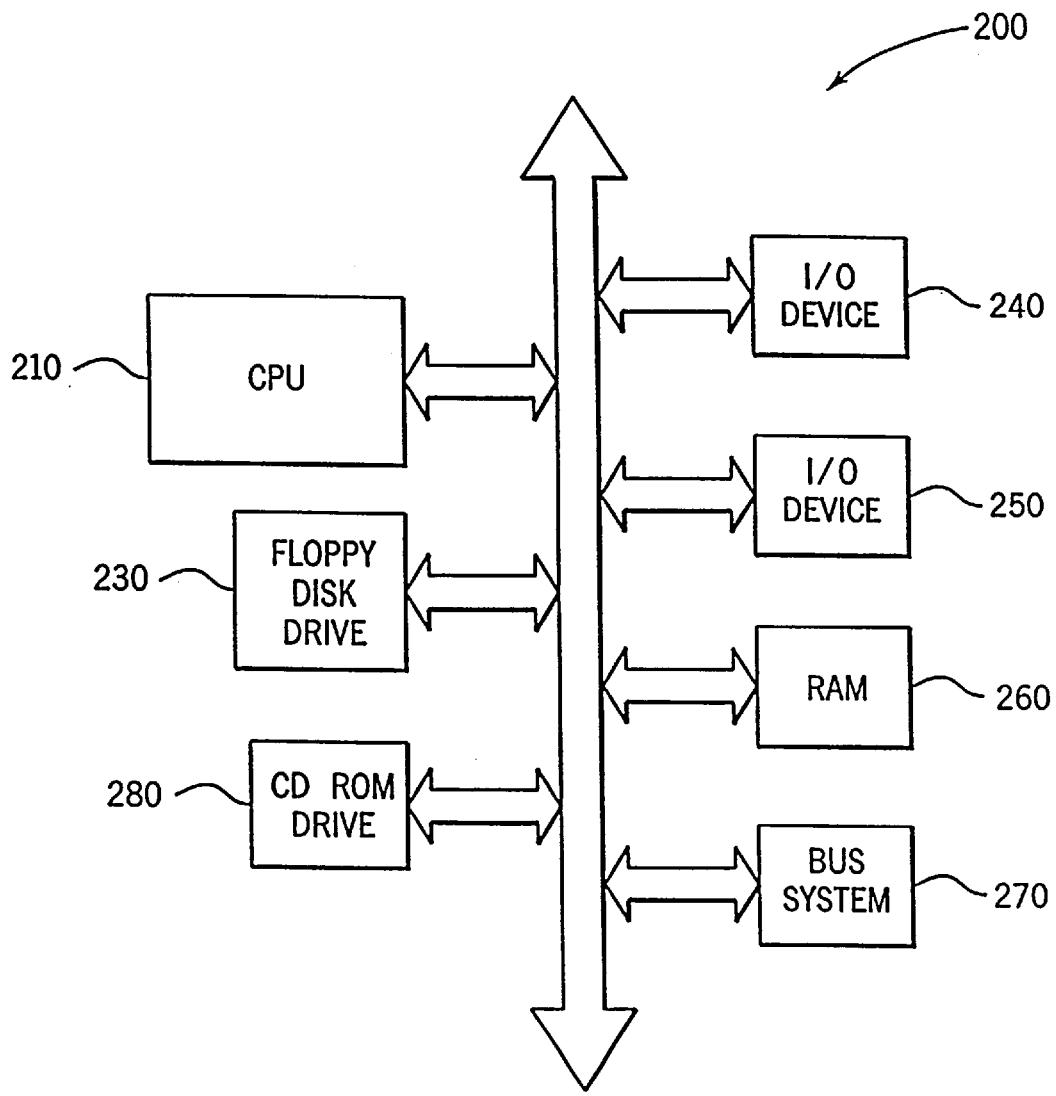
FIG. 8 is a block diagram of a typical processor based system which includes integrated circuits that utilize the film(s) of the present invention.

A typical processor based system which includes integrated circuits that utilize one or more of the films formed in accordance with the present invention is illustrated generally at 200 in FIG. 8. A processor based system, such as a computer system, for example, generally comprises a central processing unit (CPU) 210, for example, a microprocessor, that communicates with one or more input/output (I/O) devices 240, and a hard drive 250 over a bus system 270 which may include one or more busses and/or bus bridges. The computer system 200 also includes a hard disk drive 220, a floppy disk drive 230, a random access memory (RAM) 260, a read only memory (ROM) 280 and, in the case of a computer system may include other peripheral devices such as a compact disk (CD) ROM drive 230 which also communicate with CPU 210 over the bus 270. The invention may be used in one or more of the processor, RAM and ROM. While FIG. 8 shows one exemplary computer system architecture, many others are also possible.

The foregoing description is illustrative of exemplary embodiments which achieve the objects, features and advantages of the present invention. It should be apparent that many changes, modifications, substitutions may be made to the described embodiments without departing from the spirit or scope of the invention. The invention is not to be considered as limited by the foregoing description or embodiments, but is only limited by the construed scope of the appended claims.

What is claimed as new and desired to be protected by Letters Patent of the United States is:

1. A method of depositing a film on a substrate of a semiconductor device, comprising:
    a.) exposing said substrate to at least one adherent material in a quantity sufficient for said material to adsorb onto said substrate to thereby form an initiation layer, said initiation layer presenting at least one first reactive moiety;
    b.) chemically reacting said first reactive moiety with at least one first reaction material to form a second reactive moiety; and
    c.) chemically reacting said second reactive moiety with at least one second reaction material, wherein said steps a) through c) are performed under atomic layer deposition conditions sufficient to form at least one reaction layer over said initiation layer.

2. The method of claim 1, further comprising the step of again reacting said first reaction material with said second reaction material after completion of step c) to form at least one additional reaction layer over said at least one reaction layer.

3. The method of claim 2, wherein said step of again reacting is performed at least five times.

4. The method of claim 3, wherein said step of again reacting is performed at least ten times.

5. The method of claim 1, wherein a level of adsorption by said adherent material is equal to or greater than about 30% after formation of said initiation layer.

6. The method of claim 5, wherein a level of adsorption by said adherent material is greater than about 50%.

7. The method of claim 6, wherein said level is at least about 80%.

8. The method of claim 7, wherein said level is at least about 90%.

9. The method of claim 1, wherein said moiety is sterically favored to react with said at least one first reaction material.

10. The method of claim 1, wherein said adherent material is substantially substrate independent.

11. The method of claim 10, wherein said substrate is comprised of silicon or a silicon-containing compound or alloy.

12. The method of claim 10, wherein said substrate comprises silicon.

13. The method of claim 1, wherein said moiety is a sterically favored ligand group.

14. The method of claim 1, wherein said atomic layer deposition is performed at a temperature within the range of about 100 to about 600° C.

15. The method of claim 14, wherein said atomic layer deposition is performed at a temperature within the range of about 200 to about 400° C.

16. The method of claim 15, wherein said atomic layer deposition is performed at a temperature within the range of about 250 to about 350° C.

17. The method of claim 14, wherein said atomic layer deposition is performed at an operating pressure within the range of about 1.0 milliTorr to about 10 Torr.

18. The method of claim 17, wherein said atomic layer deposition is performed at an operating pressure within the range of about 30 milliTorr to about 1 Torr.

19. The method of claim 1, wherein said adherent material is at least one member selected from the group consisting of titanium-containing compounds.

20. The method of claim 19, wherein said at least one first reaction material is at least one gaseous nitrogen-containing compound, and said adherent material is at least one member from the group of tetrakisdimethylamino titanium and titanium chloride.

21. The method of claim 20, wherein said at least one first reaction material is at least one member selected from the group consisting of nitric oxide, nitrous oxide, nitrogen and ammonia.

22. The method of claim 21, wherein said at least one first reaction material is selected from the group consisting of nitrogen and ammonia.

23. The method of claim 22, wherein said at least one first reaction material is ammonia.

24. The method of claim 20, wherein said at least one second reaction material is at least one member selected from the group consisting of metal bearing compounds.

25. The method of claim 24, wherein said at least one second reaction material is at least one member selected from the group consisting of tungsten-containing compounds.

26. The method of claim 25, wherein said at least one second reaction material is tungsten fluoride ($WF_6$) and said reaction layer is comprised of $WN_x$.

27. The method of claim 1, wherein steps a), b) and c) are repeated at least twice on different parts of said substrate.

28. The method of claim 2, further comprising the step of repeating steps a), b) and c) on different parts of said substrate.

29. A method of depositing a film on a substrate in a semiconductor device, comprising:
    a.) exposing said substrate to tetrakisdimethylamino titanium in a quantity sufficient for said compound to adsorb onto said substrate in a manner such that said adsorbed material forms an initiation layer over said substrate and further presents at least one reactive dimethylamino ligand;

b.) reacting said at least one dimethylamino ligand with at least one first reaction material selected from the group consisting of nitrogen-bearing compounds to thereby form a second reactive moiety; and c.) reacting said second reactive moiety with a tungsten-bearing compound, wherein said steps a) through c) are performed using an atomic layer deposition process at a temperature of about 250° C. to about 350° C. so as to form a reaction layer of tungsten nitride ($WN_x$) over said initiation layer.

30. The method of claim 29, wherein said nitrogen-bearing compound is at least one member selected from the group consisting of nitrogen and ammonia gases.

31. The method of claim 29, wherein said tungsten-bearing compound is tungsten hexafluoride.

32. The method of claim 29, wherein said initiation layer is at least about 95% intact after said atomic layer deposition process.

33. A method of depositing a film on a substrate of a semiconductor device, comprising:

a.) exposing said substrate to at least one chemisorbent material in a quantity sufficient for said material to stick onto said substrate to thereby form an initiation layer, said initiation layer presenting at least one first reactive moiety;

b.) chemically reacting said first reactive moiety with at least one first reaction material to form a second reactive moiety; and c.) chemically reacting said second reactive moiety with at least one second reaction material, wherein said steps a) through c) are performed under atomic layer deposition conditions sufficient to form at least one reaction layer over said initiation layer.

* * * * *